(12) United States Patent
Wang et al.

(10) Patent No.: US 12,422,710 B2
(45) Date of Patent: Sep. 23, 2025

(54) FULLY LAMINATED OUTDOOR ADVERTISING MACHINE

(71) Applicant: Shenzhen Xunbao Juneng Technology Co., Ltd., Shenzhen (CN)

(72) Inventors: Peiyong Wang, Shenzhen (CN); Jialong Wang, Shenzhen (CN)

( * ) Notice: Subject to any disclaimer, the term of this patent is extended or adjusted under 35 U.S.C. 154(b) by 0 days.

(21) Appl. No.: 18/610,870

(22) Filed: Mar. 20, 2024

(65) Prior Publication Data

US 2025/0138357 A1 May 1, 2025

(30) Foreign Application Priority Data

Oct. 27, 2023 (CN) .......................... 202322912389.4

(51) Int. Cl.
*G02F 1/1333* (2006.01)
*G09F 9/35* (2006.01)

(52) U.S. Cl.
CPC .. *G02F 1/133385* (2013.01); *G02F 1/133314* (2021.01); *G02F 1/133331* (2021.01); *G09F 9/35* (2013.01)

(58) Field of Classification Search
None
See application file for complete search history.

(56) References Cited

U.S. PATENT DOCUMENTS

2014/0184980 A1* 7/2014 Onoue .................. G02F 1/1336
349/58
2015/0237761 A1* 8/2015 Dunn ................ H05K 7/20972
362/97.3

FOREIGN PATENT DOCUMENTS

CN 216353162 U 4/2022
CN 220419762 U 1/2024

* cited by examiner

*Primary Examiner* — Richard H Kim

(57) ABSTRACT

The present application provides a fully laminated outdoor advertising machine, which includes a base plate, a liquid crystal screen, a tempered glass screen, an air blowing device, a battery box and an electronic control box; the tempered glass screen is adhered to a front of the liquid crystal screen, the base plate is covered and fastened to a back of the liquid crystal screen; a space for ventilation and heat dissipation is formed between the base plate and the liquid crystal screen, and the back of the base plate is provided with an air inlet and an air outlet; and the air inlet and the air outlet are connected to each other through the space for ventilation and heat dissipation, the air inlet is located between the battery box and the electronic control box, and the air blowing device is provided at the air inlet.

8 Claims, 5 Drawing Sheets

FULLY LAMINATED OUTDOOR ADVERTISING MACHINE

CROSS-REFERENCE TO RELATED APPLICATIONS

The present application claims priority to Chinese Patent Application No. 202322912389.4, titled "Fully Laminated Outdoor Advertising Machine", filed Oct. 27, 2023, the entire disclosure of which is incorporated herein by reference.

TECHNICAL FIELD

The present application relates to the technical field of advertising machine, and specifically relates to a fully laminated outdoor advertising machine.

BACKGROUND

Fully laminated outdoor advertising machine can run 24 hours a day, and is a persistent, all-weather communication media, and usually used in outdoor places with more traffic, such as pedestrian streets, roadsides, bus stops, etc., and used to provide timely information dissemination to outdoor activities of people, to facilitate providing broadly outdoor advertising broadcasting, outdoor public information dissemination, outdoor media dissemination, touch interactive query and other information display. In order to dissipate the heat of the fully laminated outdoor advertising machine to ensure its normal operation, the fully laminated outdoor advertising machine in the existing technology is usually equipped with a heat dissipation device. However, as in most of the fully laminated outdoor advertising machines in the existing technology, the batteries, circuit boards and other electronic control components are provided inside, so that the batteries, circuit boards and other electronic control components and the high-brightness liquid crystal screen are located in a space, with a smaller distance among them. Due to the existence of the batteries, circuit boards and other electronic control components, a space for heat dissipation inside the housing becomes narrow, thus the narrow space for heat dissipation is not only easy to lead to gathering of heat generated by the battery, circuit boards and other electronic control components and the high-brightness liquid crystal screen, but also easy to lead to a very limited heat dissipation acted by the heat dissipation device because the generation and gathering speed of the heat are much greater than the speed of heat dissipation, otherwise, the heat dissipation device needs to be always maintained an efficient operation for a long time, which in turn will affect the performance and the service life of the heat dissipation device.

SUMMARY

The technical problem to be solved by the present application is to provide a fully laminated outdoor advertising machine for the above defects of the existing technology.

The technical solution adopted by the present application to solve the technical problem is a fully laminated outdoor advertising machine, which includes a base plate, a liquid crystal screen, a tempered glass screen, an air blowing device, a battery box and an electronic control box; the tempered glass screen is adhered to a front of the liquid crystal screen, the base plate is covered and fastened on a back of the liquid crystal screen, and the front of the base plate is opposite to the back of the liquid crystal screen; a space for ventilation and heat dissipation is formed between the base plate and the liquid crystal screen; the battery box and the electronic control box are correspondingly provided up and down at the back of the base plate, and the back of the base plate is provided with an air inlet and an air outlet; and the air inlet and the air outlet are connected to each other through the space for ventilation and heat dissipation, the air inlet is located between the battery box and the electronic control box, and the air blowing device is provided at the air inlet.

In one embodiment, the fully laminated outdoor advertising machine includes two air outlets. One of the two air outlets is located above the battery box, and the other of the two air outlets is located below the electronic control box.

In one embodiment, the base plate includes a first mounting plate and an enclosure plate, the enclosure plate is provided at a peripheral edge in a front of the first mounting plate, and the first mounting plate is provided at the back of the liquid crystal screen through the enclosure plate.

In one embodiment, the back of the liquid crystal screen is provided with a second mounting plate, and the second mounting plate is fixed to the first mounting plate by fasteners.

In one embodiment, the first mounting plate is provided with a plurality of first positioning screw holes, the second mounting plate is provided with a plurality of second positioning screw holes, and the plurality of second positioning screw holes correspond to the plurality of first positioning screw holes one by one.

In one embodiment, the fully laminated outdoor advertising machine includes four second mounting plates, and two of the four second mounting plates are provided on upper and lower edges of the back of the liquid crystal screen correspondingly and near an edge of the liquid crystal screen; and another two of the four second mounting plates are provided on left and right edges of the back of the liquid crystal screen correspondingly and near the edge of the liquid crystal screen.

In one embodiment, a mounting frame is provided at the back of the base plate in the air inlet, and an accommodation space for the air blowing device corresponding to the air inlet is provided in the mounting frame, and the air blowing device is provided on the mounting frame and accommodated in the accommodation space for the air blowing device.

In one embodiment, the base plate is provided with a wire outlet port connected to the electronic control box.

In one embodiment, the liquid crystal screen is provided with a wire discharge port corresponding to the wire outlet port.

In one embodiment, the air blowing device is a fan.

Compared with the existing technology, the beneficial effect of the present application is that in the fully integrated outdoor advertising machine, the battery box and the electronic control box are provided separately, and the battery box and the electronic control box are located outside the space for ventilation and heat dissipation, so that the heat generated by the battery box and the electronic control box is not easy to be gathered in the space for ventilation and heat dissipation, and easy to be dispersed out. Since the air inlet is provided between the battery box and the electronic control box, the cold air from the air inlet can be rapidly diverted to everywhere in the space for ventilation and heat dissipation, which can effectively prevent the heat from being gathered, and thus the heat dissipation efficiency of the overall interior of the fully laminated outdoor advertising machine is effectively improved, with a better heat dissipation effect.

DETAILED DESCRIPTION OF THE EMBODIMENTS

Figure 1:
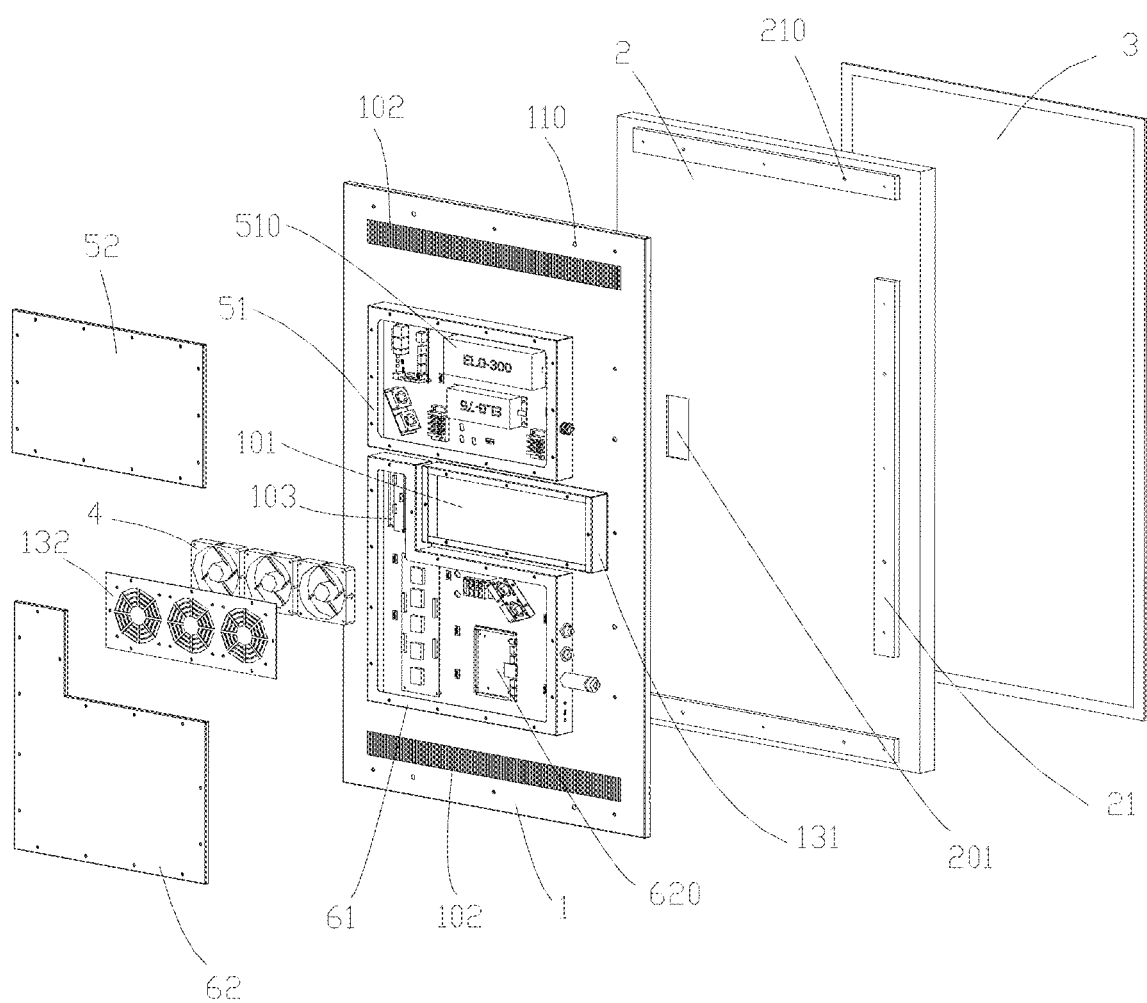
FIG. 1 is a schematic diagram of a rear side view decomposition structure of the fully laminated outdoor advertising machine according to an embodiment of the present application.

In order to make the purpose, technical solutions and advantages of the embodiments of the present application clearer, the following will be a clear and complete description in conjunction with the technical solutions in the embodiments of the present application, and it is obvious that the described embodiments are part of the embodiments of the present application and not all of the embodiments. Based on the embodiments of the present application, all other embodiments obtained by those skilled in the art without creative labour fall within the scope of the present application. In addition, the directional terms mentioned in the present application, such as, for example, "upper", "lower", "inner", "outer" and so on, only reference to the directions shown in the additional drawings, and the directional terms used are for the purpose of better and clearer description and understanding of the present application, and are not indicative of or alluding to the orientation that the present application must have, and thus are not to be construed as a limitation of the present application.

As shown in FIGS. 1 to 6, the present application is a fully laminated outdoor advertising machine, which includes a base plate 1, a liquid crystal screen 2, a tempered glass screen 3, an air blowing device 4, a battery box 5, and an electronic control box 6. The tempered glass screen 3 is adhered to a front of the liquid crystal screen 2. The base plate 1 is covered and fastened to a back of the liquid crystal screen 2. The front of the base plate 1 is opposite to the back of the liquid crystal screen 2, and a space for ventilation and heat dissipation is provided between the base plate 1 and the liquid crystal screen 2. The battery box 5 and the electronic control box 6 are correspondingly provided up and down at the back of the base plate 1. The back of the base plate 1 is also provided with an air inlet 101 and an air outlet 102, and the air inlet 101 and the air outlet 102 are connected to each other through the space for ventilation and heat dissipation. The air inlet 101 is located between the battery box 5 and the electronic control box 6, and the air blowing device 4 is provided at the air inlet 101.

Figure 6:
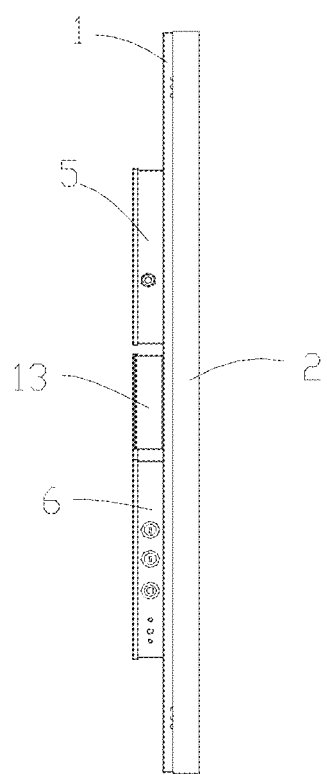
FIG. 6 is a structural schematic diagram of the side of the fully laminated outdoor advertising machine according to the embodiment of the present application.

As shown in FIGS. 1 and 6, there are two air outlets 102, one of two air outlets 102 is located above the battery box 5, and the other of two air outlets 102 is located below the electronic control box 6, such that the hot air in the space for ventilation and heat dissipation can be more evenly distributed, and then the cold air after entering from the air inlet 101 can be diverted, thereby effectively preventing the heat from being gathered in the space for ventilation and heat dissipation, and improving the heat dissipation efficiency of the overall interior of the fully laminated outdoor advertising machine. The air outlet 102 includes a plurality of vertically or horizontally parallel openings.

In this embodiment, the heat generated by the liquid crystal screen 2 can also be scattered into the environment through the tempered glass screen 3, which can also further improve the heat dissipation efficiency, and the heat dissipation effect is remarkable.

Figure 2:
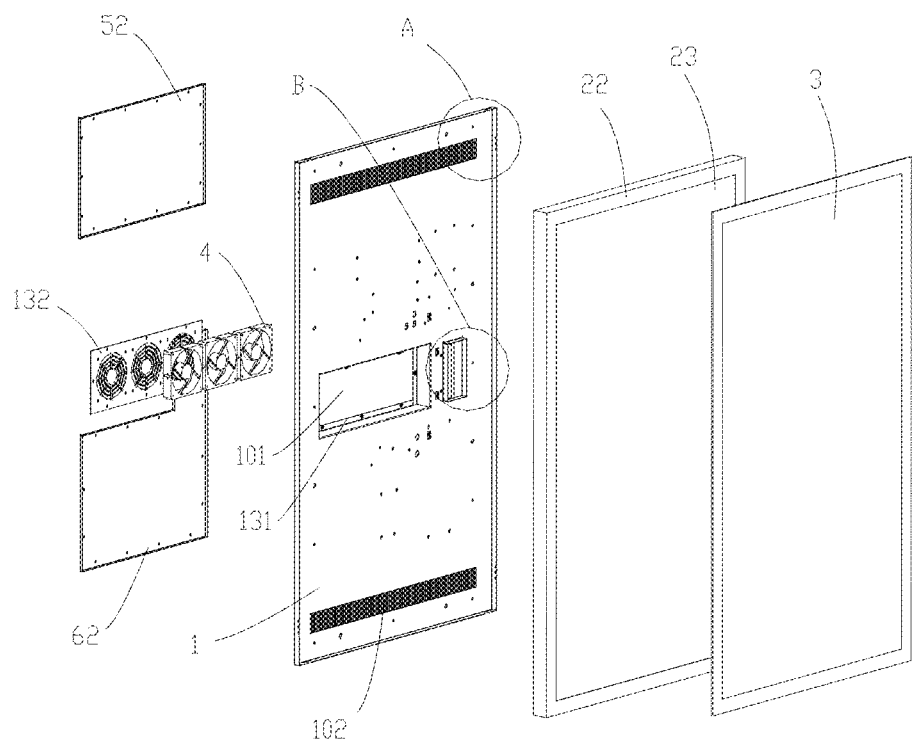
FIG. 2 is a schematic diagram of a front view decomposition structure of the fully laminated outdoor advertising machine according to the embodiment of the present application.
Figure 3:
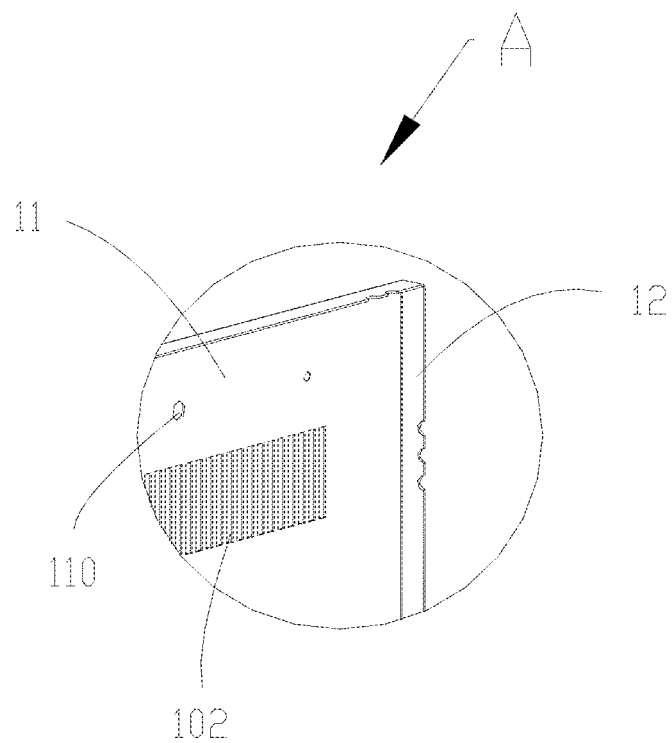
FIG. 3 is an enlarged structural schematic diagram of local A according to the embodiment of the present application.

As shown in FIGS. 2 and 3, the base plate 1 includes a first mounting plate 11 and an enclosure plate 12. The enclosure plate 12 is provided at a peripheral edge of the front of the first mounting plate 11, and the front of the first mounting plate 11 is opposite to the back of the liquid crystal screen 2. The first mounting plate 11 is provided at the back of the liquid crystal screen 2 through the enclosure plate 12. The enclosure plate 12 includes four first baffles, the four first baffles are connected in turn head to tail to form a first rectangular frame. The enclosure plate 12 is fixed to the first mounting plate 11 to form a cover plate with an opening, so that when the first mounting plate 11 and the enclosure plate 12 are covered and fastened to the back of the liquid crystal screen 2, a fully laminated outdoor advertising machine housing with an internal cavity is formed between the first mounting plate 11 and the enclosure plate 12 and the liquid crystal screen 2. The liquid crystal screen 2 is rectangular. The first mounting plate 11 is also rectangular the same as the liquid crystal screen 2.

As shown in FIG. 1, a second mounting plate 21 is provided at the back of the liquid crystal screen 2, and the second mounting plate 21 is fastened to the first mounting plate 11 by fasteners (not shown in figures). The shape of the second mounting plate 21 is a bar. The second mounting plate 21 is provided with a plurality of second positioning screw holes 210. Correspondingly, the first mounting plate 11 is provided with a plurality of first positioning screw holes 110, and the plurality of second positioning screw holes 210 correspond to the plurality of first positioning screw holes 110 one-by-one. Fasteners (not shown in the figures) include, but are not limited to, screws, etc.

In this embodiment, there are four second mounting plates 21, two of the second mounting plates 21 are provided on upper and lower edges of the back of the liquid crystal screen 2 correspondingly and near an edge of the liquid crystal screen 2, and another two of the four second mounting plates 21 are provided on left and right edges of the back of the liquid crystal screen 2 correspondingly and near the edge of the liquid crystal screen 2. The liquid crystal screen 2 includes a back plate 22 of the liquid crystal screen and a display screen 23, the display screen 23 is embedded in the front of the back plate 22 of the liquid crystal screen, and the tempered glass screen 3 is adhered to the front of the display screen 23. The four second mounting plates 21 are fixed to corresponding positions at the back of the back plate 22 of the liquid crystal screen 2 in advance according to the aforementioned distribution method, and when mounting, the first mounting plate 11 and the enclosure 12 are covered and fastened to the back of the back plate 22 of the liquid crystal screen 2, and then the four second mounting plates 21 are covered and fastened to the liquid crystal screen 2, so that the first positioning screw holes 110 on the first mounting plate 11 are aligned with the second positioning screw holes 210 on the second mounting plates 21, and then the first mounting plate 11 is fastened to the second mounting plate 21 with fasteners.

Figure 5:
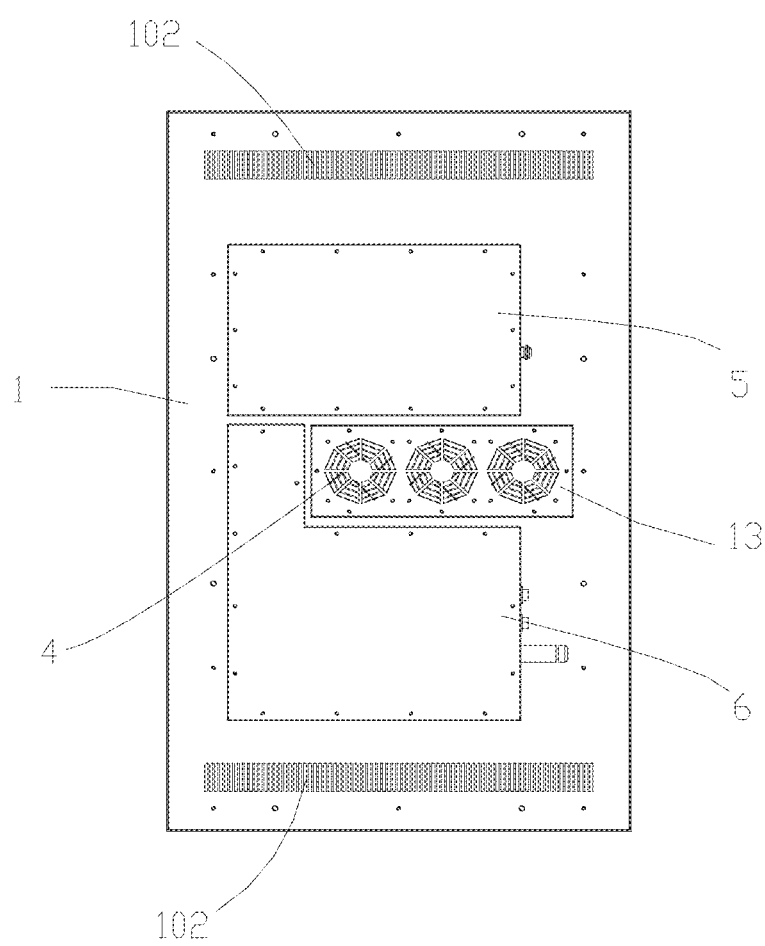
FIG. 5 is a structural schematic diagram of the back of the fully laminated outdoor advertising machine according to the embodiment of the present application.

As shown in FIGS. 1 and 5, a mounting frame 13 is provided at the back of the base plate 1 in the air inlet 101, an accommodation space for the air blowing device corresponding to the air inlet 101 is provided in the mounting frame 13, and the air blowing device 4 is accommodated in the accommodation space for the air blowing device. In this embodiment, the air blowing device 4 is a fan.

The mounting frame 13 includes four second baffles 131 and a fixing plate 132, the four second baffles 131 are connected in turn head to tail to form a second rectangular frame, and the interior of the second rectangular frame is the accommodation space for the air blowing device. The fixing plate 132 is provided on a side of the second rectangular frame, and the other side of the second rectangular frame is provided at the peripheral edge of the air inlet 101. The fixing plate 132 is provided with a fan mounting position, and when mounting the fan, the fan is fixed to the fan mounting position by screws, bolts, and other fasteners and placed in the accommodation space for the air blowing device. The fixing plate 132 is provided with a mesh-shaped vent corresponding to the fan mounting position.

In this embodiment, there are three fan mounting positions, and there are also three fans, and the number of fans corresponds to the number of fan mounting positions one by one. It should be noted that the number of the fan mounting positions and fans in this embodiment is only an example, and does not constitute a specific limitation, and can be designed and selected according to the specific requirements in actual use.

As shown in FIG. 1, the battery box 5 includes a battery box body 51 and a battery box cover 52 provided on the battery box body 51, and a switching power supply 510 is provided in the battery box body 51 to meet the power supply of the fully laminated outdoor advertising machine. The electronic control box 6 includes an electronic control box body 61 and an electronic control box cover 62 provided on the electronic control box body 61, and a control main board 620 is provided in the electronic control box 62. The switching power supply 510 is electrically connected to the control main board 620, and the control main board 620 is also electrically connected to the display screen 23. The electrical connection is made, for example, by means of wires (not shown in figures).

The base plate 1 is provided with a wire outlet port 103 connected to the electronic control box 6. The liquid crystal screen 2 is provided with a wire discharge port 201 corresponding to the wire outlet port 103. specifically, the wire outlet port 103 is provided on the first mounting plate 11 and is located in an area where the electronic control box 61 is located, through which the electronic control box 61 is connected. The wire discharge port 201 is provided on the back plate 22 of the liquid crystal screen 2. Both the outlet port 103 and the wire discharge port 201 are used for wires (not shown in the figures) to pass through. The wires (not shown in the figures) are connected to the display screen 23 after passing through the outlet port 103 and the wire discharge port 201 in turn.

Figure 4:
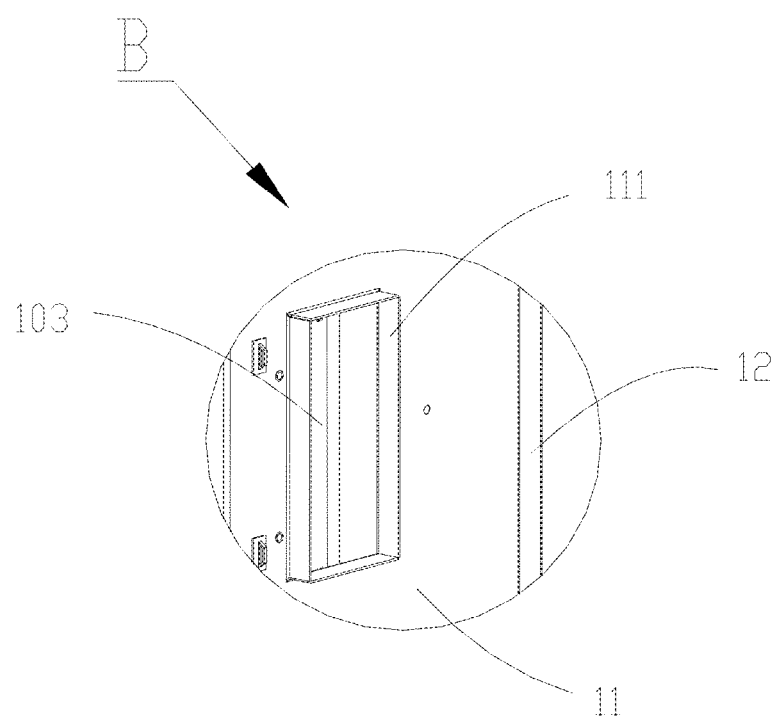
FIG. 4 is an enlarged structural schematic diagram of local B according to the embodiment of the present application.

As shown in FIGS. 2 and 4, the first mounting plate 11 is also provided with four third baffles 111 on the front of the first mounting plate at the wire outlet port 103, and the four third baffles 111 are connected in turn head to tail to enclose the wire outlet port 103. When the first mounting plate 11 and the back plate 22 of the liquid crystal screen 2 are mounted in place, the four third baffles 111 also enclose the wire outlet 201, providing better protection.

It should be understood that for those skilled in the art, improvements or transformations may be made in accordance with the above description, and all such improvements and transformations shall fall within the scope of the appending claims of the present application.

The invention claimed is:

1. A fully laminated outdoor advertising machine, comprising a base plate, a liquid crystal screen, a tempered glass screen, an air blowing device, a battery box and an electronic control box;
wherein the tempered glass screen is adhered to a front of the liquid crystal screen, wherein the base plate comprises a first mounting plate and an enclosure plate, the enclosure plate is provided at a peripheral edge in a front of the first mounting plate, and the first mounting plate is provided at the back of the liquid crystal screen through the enclosure plate; the base plate is covered on edges of the liquid crystal screen and fastened to a back of the liquid crystal screen, and the front of the base plate is opposite to the back of the liquid crystal screen;
a space for ventilation and heat dissipation is formed between the base plate and the liquid crystal screen;
the battery box and the electronic control box are correspondingly provided up and down at the back of the base plate, and the back of the base plate is provided with an air inlet and an air outlet; and
the air inlet and the air outlet are connected to each other through the space for ventilation and heat dissipation, the air inlet is located between the battery box and the electronic control box, and the air blowing device is provided at the air inlet;
wherein the fully laminated outdoor advertising machine comprises two air outlets, the two air outlets are respectively located on two opposite sides of the bottom plate;
wherein one of the two air outlets is located above the battery box, and the other of the two air outlets is located below the electronic control box.

2. The fully laminated outdoor advertising machine according to claim 1, wherein the back of the liquid crystal screen is provided with a second mounting plate, and the second mounting plate is fixed to the first mounting plate by fasteners.

3. The fully laminated outdoor advertising machine according to claim 2, wherein the first mounting plate is provided with a plurality of first positioning screw holes, the second mounting plate is provided with a plurality of second positioning screw holes, and the plurality of second positioning screw holes correspond to the plurality of first positioning screw holes one by one.

4. The fully laminated outdoor advertising machine according to claim 2, wherein the fully laminated outdoor advertising machine comprises four second mounting plates, and two of the four second mounting plates are provided on upper and lower edges of the back of the liquid crystal screen correspondingly and near an edge of the liquid crystal screen; and another two of the four second mounting plates are provided on left and right edges of the back of the liquid crystal screen correspondingly and near the edge of the liquid crystal screen.

5. The fully laminated outdoor advertising machine according to claim 1, wherein a mounting frame is provided at the back of the base plate in the air inlet, and an accommodation space for the air blowing device corresponding to the air inlet is provided in the mounting frame, and the air blowing device is provided on the mounting frame and accommodated in the accommodation space for the air blowing device.

6. The fully laminated outdoor advertising machine according to claim 1, wherein the base plate is provided with a wire outlet port connected to the electronic control box.

7. The fully laminated outdoor advertising machine according to claim 6, wherein the liquid crystal screen is provided with a wire discharge port corresponding to the wire outlet port.

8. The fully laminated outdoor advertising machine according to claim 1, wherein the air blowing device is a fan.

* * * * *